(12) United States Patent
Tsumura et al.

(10) Patent No.: US 12,158,480 B2
(45) Date of Patent: Dec. 3, 2024

(54) INSPECTION JIG AND INSPECTION DEVICE

(71) Applicant: NIDEC READ CORPORATION, Muko (JP)

(72) Inventors: Kohei Tsumura, Muko (JP); Hidekazu Yamazaki, Muko (JP)

(73) Assignee: NIDEC READ CORPORATION, Kyoto (JP)

( * ) Notice: Subject to any disclaimer, the term of this patent is extended or adjusted under 35 U.S.C. 154(b) by 122 days.

(21) Appl. No.: 17/917,950

(22) PCT Filed: Apr. 19, 2021

(86) PCT No.: PCT/JP2021/015923
§ 371 (c)(1),
(2) Date: Oct. 10, 2022

(87) PCT Pub. No.: WO2021/206185
PCT Pub. Date: Oct. 14, 2021

(65) Prior Publication Data
US 2023/0138341 A1    May 4, 2023

(30) Foreign Application Priority Data

Apr. 10, 2020 (JP) .................................. 2020-071031
Jul. 31, 2020 (JP) .................................. 2020-131206

(51) Int. Cl.
*G01R 1/067* (2006.01)
(52) U.S. Cl.
CPC ................................ *G01R 1/06733* (2013.01)

(58) Field of Classification Search
CPC .................................................. G01R 1/06733
See application file for complete search history.

(56) References Cited

U.S. PATENT DOCUMENTS

2019/0271722 A1    9/2019    Yamazaki et al.

FOREIGN PATENT DOCUMENTS

| JP | H08201427 A | 8/1996 | |
|----|----|----|----|
| JP | 2007271631 A | 10/2007 | |
| JP | 2008249460 A | 10/2008 | |
| JP | 2012103125 A | 5/2012 | |
| JP | 2016006401 A | 1/2016 | |
| WO | WO-2018198859 A1 * | 11/2018 | ............... G01R 1/06 |

OTHER PUBLICATIONS

Translation of KR 20100124929 A (Year: 2010).*

* cited by examiner

*Primary Examiner* — Paresh Patel
(74) *Attorney, Agent, or Firm* — VIERING, JENTSCHURA & PARTNER MBB

(57) ABSTRACT

An inspection jig includes a rod-shaped probe, a first support portion that supports one end portion side of the probe, a second support portion that supports the other end portion side of the probe, and a separation holding member that holds the first support portion and the second support portion to be separated from each other. The first support portion includes a support plate in which a through hole through which the probe is inserted is formed. A reinforcing plate having bending strength stronger than that of the support plate is disposed on a surface of the support plate facing the second support portion.

20 Claims, 12 Drawing Sheets

INSPECTION JIG AND INSPECTION DEVICE

CROSS-REFERENCE TO RELATED APPLICATIONS

This application is a U.S. National Stage Application of International Application No. PCT/JP2021/015923, filed on Apr. 19, 2021, and claims priority under 35 U.S.C. § 119(a) and 35 U.S.C. § 365(b) from Japanese Patent Application No. 2020-071031, filed on Apr. 10, 2020 and Japanese Patent Application No. 2020-131206, filed on Jul. 31, 2020; the disclosures of which are incorporated herein by reference.

FIELD

Various embodiments of the present disclosure relate to an inspection jig including a probe and an inspection device using the inspection jig.

BACKGROUND

Conventionally, there has been known a probe card including a support member having an upper support hole and a lower support hole that respectively position and support an upper portion and a lower portion of a wire probe, and a flexible guide film that supports an intermediate portion of the wire probe by bending the intermediate portion in one direction. The lower support hole of the support member is formed in a first bottom plate and a second bottom plate that are stacked.

When the guide film is too flexible, the guide film may stretch and warp up and down due to elasticity of the wire probe. Therefore, in the technique described above, a reinforcing film that suppresses bending accompanying expansion and contraction of the guide film is applied to the surface of the guide film.

Meanwhile, in the technique described above, the force for bending the guide film up and down is also applied to the first and second bottom plates having the lower support holes through which the wire probes are inserted, similarly to the guide film. Therefore, stress may be applied to the first and second bottom plates.

SUMMARY

An inspection jig according to an example of the present disclosure includes: a rod-shaped probe; a first support portion configured to support one end portion side of the probe; a second support portion configured to support another end portion side of the probe; and a separation holding member configured to hold the first support portion and the second support portion while separating the first support portion and the second support portion from each other. The first support portion includes a support plate in which a through hole through which the probe is inserted is formed. A reinforcing plate having bending strength higher than bending strength of the support plate is disposed on a surface of the support plate facing the second support portion.

An inspection device according to an exemplary embodiment of the present disclosure includes the inspection jig described above and an inspection processing unit that inspects an inspection object based on an electric signal obtained by bringing the probe into contact with an inspection point provided on the inspection object.

The above and other elements, features, steps, characteristics and advantages of the present disclosure will become more apparent from the following detailed description of the various embodiments with reference to the attached drawings.

DETAILED DESCRIPTION

Figure 1:
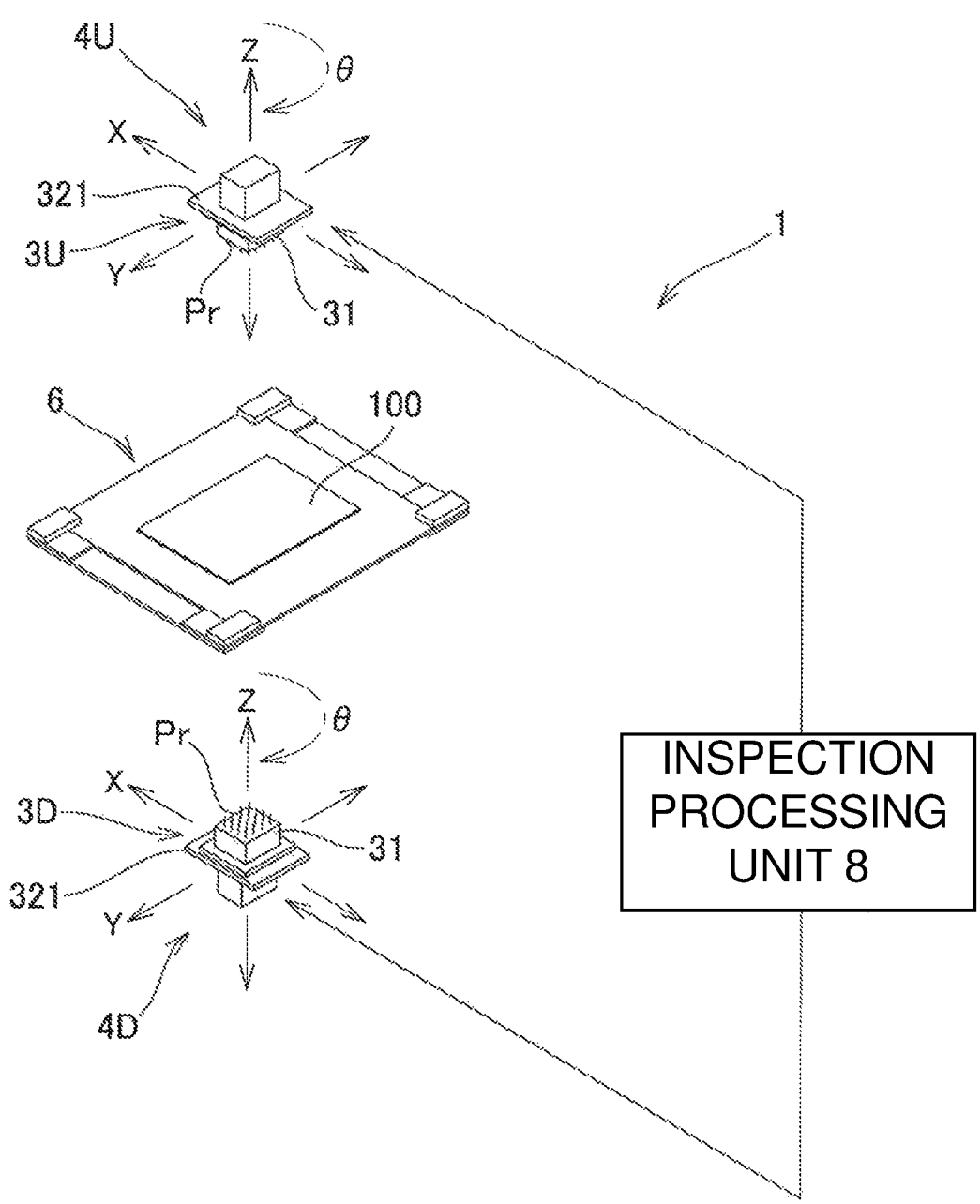
FIG. 1 is a conceptual diagram schematically illustrating an example of a configuration of an inspection device using an inspection jig according to an exemplary embodiment of the present disclosure.

Hereinafter, embodiments of the present disclosure will be described with reference to drawings. In the drawings, configurations indicated by the same reference numerals denote the same configurations, and description of such configurations will be omitted. XYZ orthogonal coordinate axes are appropriately described to indicate directions of the drawings. An inspection device 1 illustrated in FIG. 1 is an apparatus for inspecting a board 100 which is an example of an inspection object.

The board 100 may be various substrates such as a printed wiring substrate, a flexible substrate, a ceramic multilayer wiring substrate, an electrode plate for a liquid crystal display or a plasma display, a semiconductor substrate, a package substrate for a semiconductor package, and a film carrier. The inspection object may not necessarily be a board, but may alternatively be, for example, an electronic component such as a semiconductor device (e.g., an integrated circuit (IC)), or any other device subject to an electric inspection.

The inspection device 1 illustrated in FIG. 1 includes inspection portions 4U and 4D, a board fixing device 6, and an inspection processing unit 8. The board fixing device 6 is configured to fix the board 100 to be inspected at a predetermined position. The inspection portions 4U and 4D include inspection jigs 3U and 3D. Respectively, in the inspection portions 4U and 4D, a not-illustrated driving mechanism enables the inspection jigs 3U and 3D to move in directions of X, Y, and Z axes perpendicular to each other and to rotate about the Z axis.

The inspection portion 4U is arranged above the board 100 fixed by the board fixing device 6. The inspection portion 4D is located below the board 100 fixed to the board fixing device 6. The inspection portions 4U and 4D are configured such that the inspection jigs 3U and 3D for inspecting a circuit pattern formed on the board 100 are detachable. Hereinafter, the inspection portions 4U and 4D will be collectively referred to as an inspection portion 4 as appropriate.

Each of the inspection jigs 3U and 3D includes a plurality of probes Pr, a support member 31 that holds tip portions of the plurality of the probes Pr toward the board 100, and a base plate 321. The base plate 321 is provided with an electrode that comes into contact with and conducts to a rear end portion of the probes Pr. The inspection portions 4U and 4D include a connection circuit (not illustrated) that electrically connects the rear end portions of the probes Pr to the inspection processing unit 8 via the electrodes of the base plate 321 and switches the connection.

The probe Pr has a substantially bar-like shape as a whole. A plurality of through holes for supporting the probe Pr is formed in the support member 31. Each through hole is disposed so as to correspond to a position of an inspection point set on a wiring pattern of the board 100 to be inspected. In this manner, the tip portion of the probe Pr is brought into contact with the inspection point of the board 100. The inspection point is, for example, a wiring pattern, a pad, a solder bump, a connection terminal, a through hole, a via, or the like.

The inspection jigs 3U and 3D are configured similarly to each other except that the mounting directions on the inspection portions 4U and 4D are vertically opposite. Hereinafter, the inspection jigs 3U and 3D are collectively referred to as an inspection jig 3. The inspection jig 3 is replaceable according to the board 100 to be inspected.

The inspection processing unit 8 includes, for example, a power supply circuit, a voltmeter, an ammeter, a microcomputer, and so on. The inspection processing unit 8 controls a drive mechanism (not illustrated) to move and position the inspection portions 4U and 4D, and brings tip ends of the probes Pr into contact with the inspection points of the board 100. In this manner, the inspection points and the inspection processing unit 8 are electrically connected. In this state, the inspection processing unit 8 supplies current or voltage for inspection to the inspection points of the board 100 via the probes Pr of the inspection jig 3, and executes, for example, inspection of the board 100 for disconnection, short circuit, or the like of a circuit pattern based on a voltage signal or a current signal obtained from the probes Pr. Alternatively, the inspection processing unit 8 may measure an impedance to be inspected based on a voltage signal or a current signal obtained from the probes Pr by supplying AC current or voltage to the inspection points.

Figure 2:
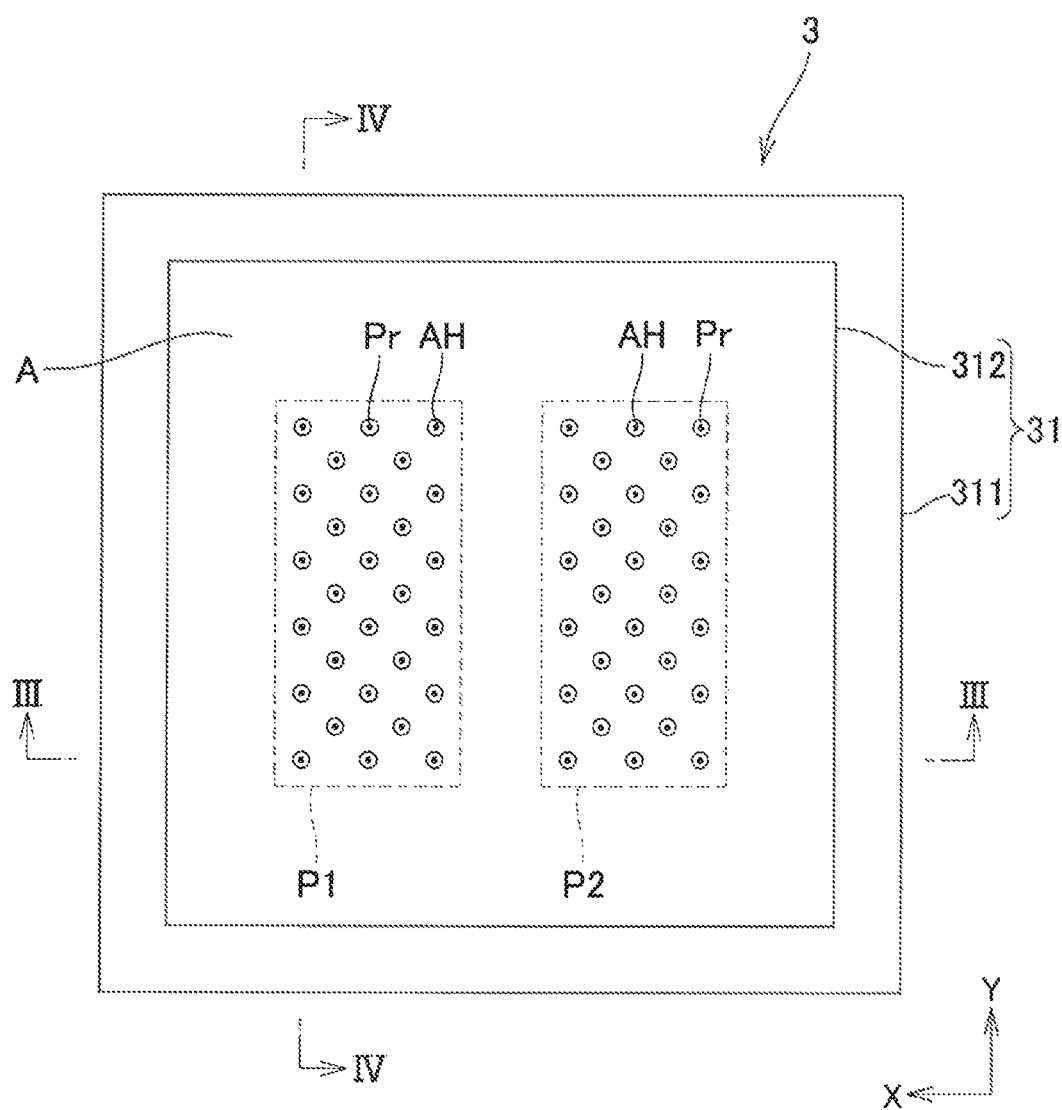
FIG. 2 is a plan view of the inspection jig illustrated in FIG. 1 as viewed from the tip end side of a probe.
Figure 3:
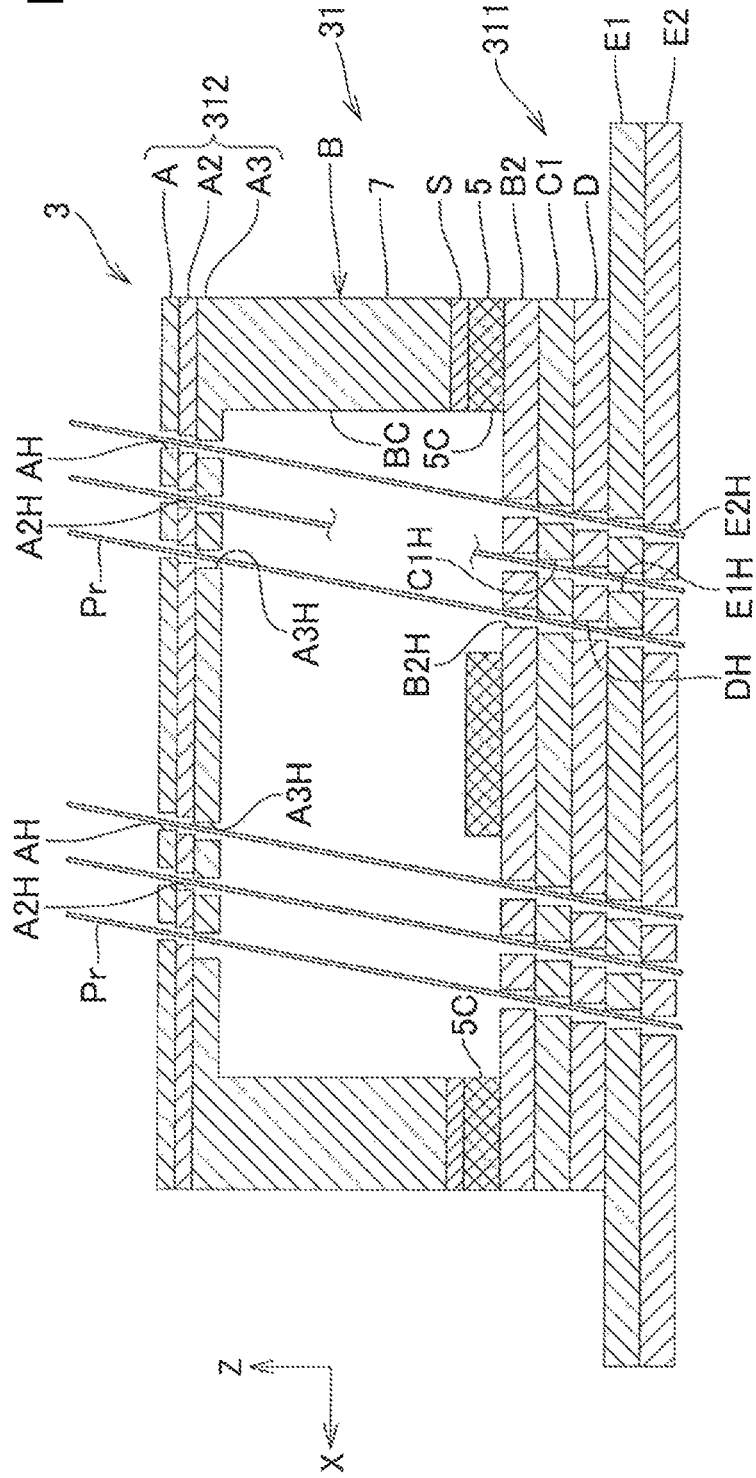
FIG. 3 is an end view taken along line III-III of the inspection jig illustrated in FIG. 2.
Figure 4:
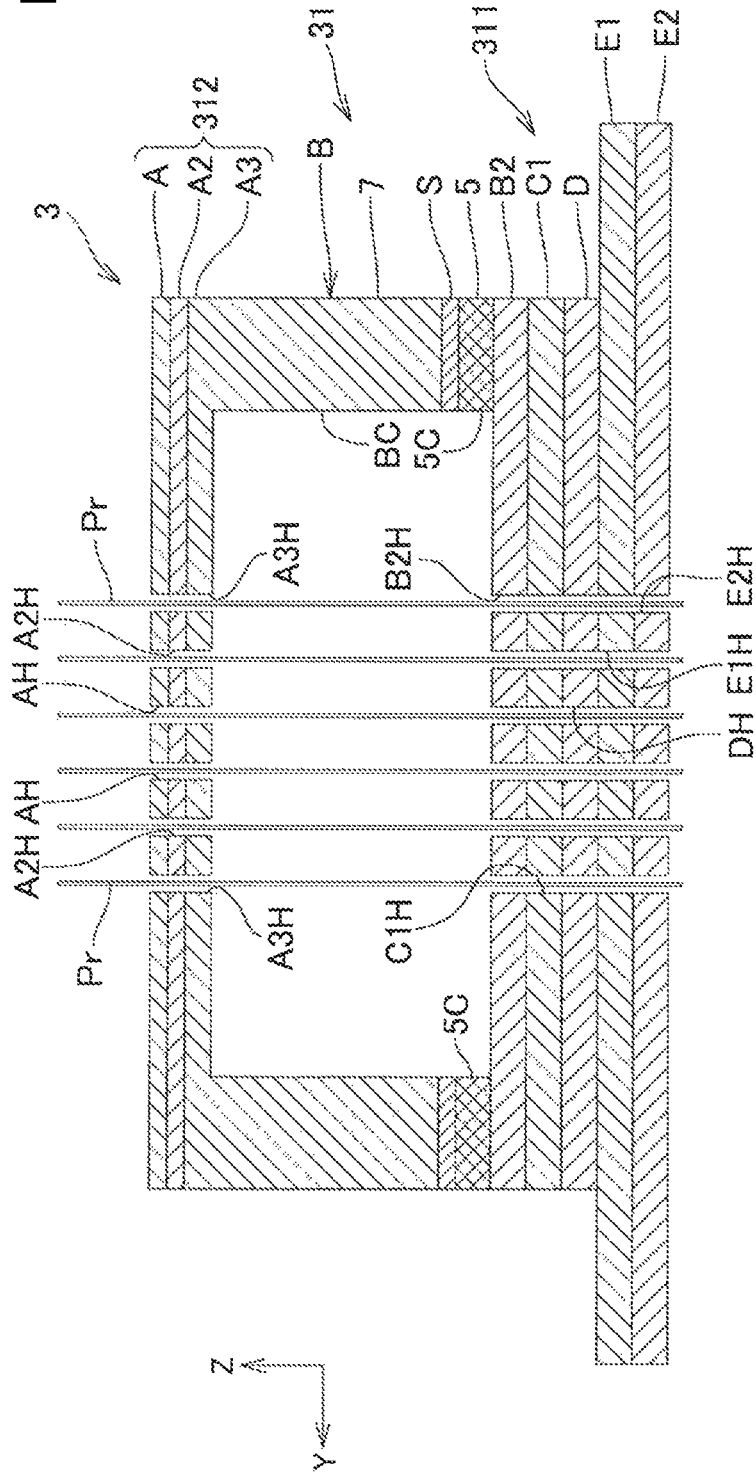
FIG. 4 is an end view taken along line IV-IV of the inspection jig illustrated in FIG. 2.

Referring to FIGS. 2, 3, and 4, the support member 31 includes a first support portion 311 that supports the rear end portion side of the probe Pr, a second support portion 312 that supports the tip end side of the probe Pr, a separation holding member 7 that holds the first support portion 311 and the second support portion 312 by separating them from each other, a spacer S, and a reinforcing plate 5.

The first support portion 311 is formed by stacking a first support plate B2 and second support plates C1, D, E1, and E2 in the Z direction. The second support plates C1, D, E1, and E2 are stacked in this order from the side closer to the second support portion 312. The first support plate B2 is stacked on the second support plate C1. That is, of the plurality of support plates B2, C1, D, E1, and E2 constituting the first support portion 311, the support plate closest to the second support portion 312 is the first support plate B2 (opposing support plate).

The second support plate may include three or less support plates or five or more support plates. Alternatively, the first support portion 311 may be configured by one support plate.

A through hole B2H for supporting each probe Pr is formed in the first support plate B2.

Through holes C1H, DH, E1H, and E2H for supporting the probes Pr are formed in the second support plates C1, D, E1, and E2.

The rear end side of the probe Pr is inserted through the through holes B2H, C1H, DH, E1H, and E2H. In this manner, the rear end side of the probe Pr is supported by the first support portion 311.

Figure 5:
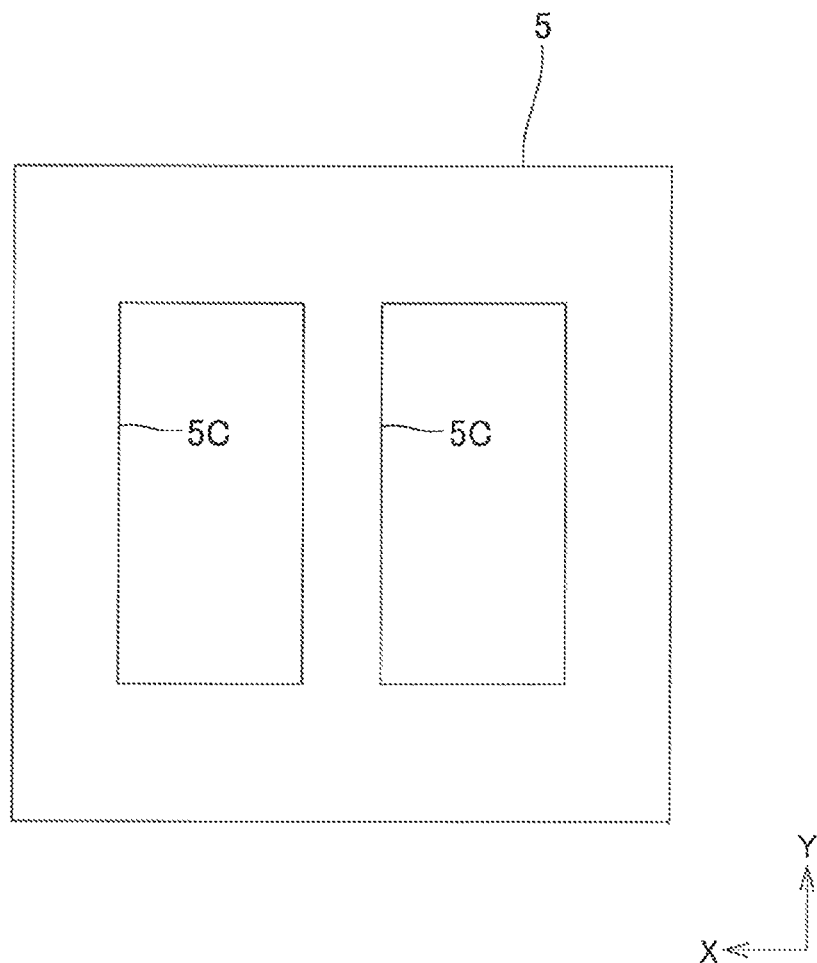
FIG. 5 is a plan view of a reinforcing plate illustrated in FIGS. 3 and 4 as viewed from the Z direction.

The reinforcing plate 5 is disposed on a surface of the first support plate B2 facing the second support portion 312. Referring to FIG. 5, the reinforcing plate 5 is a substantially rectangular plate-like member. Two substantially rectangular opening portions 5C elongated in the Y direction are formed in the reinforcing plate 5. The two opening portions 5C are opened so as to include a region including the plurality of through holes B2H of the first support plate B2 in each opening in plan view.

Figure 6:
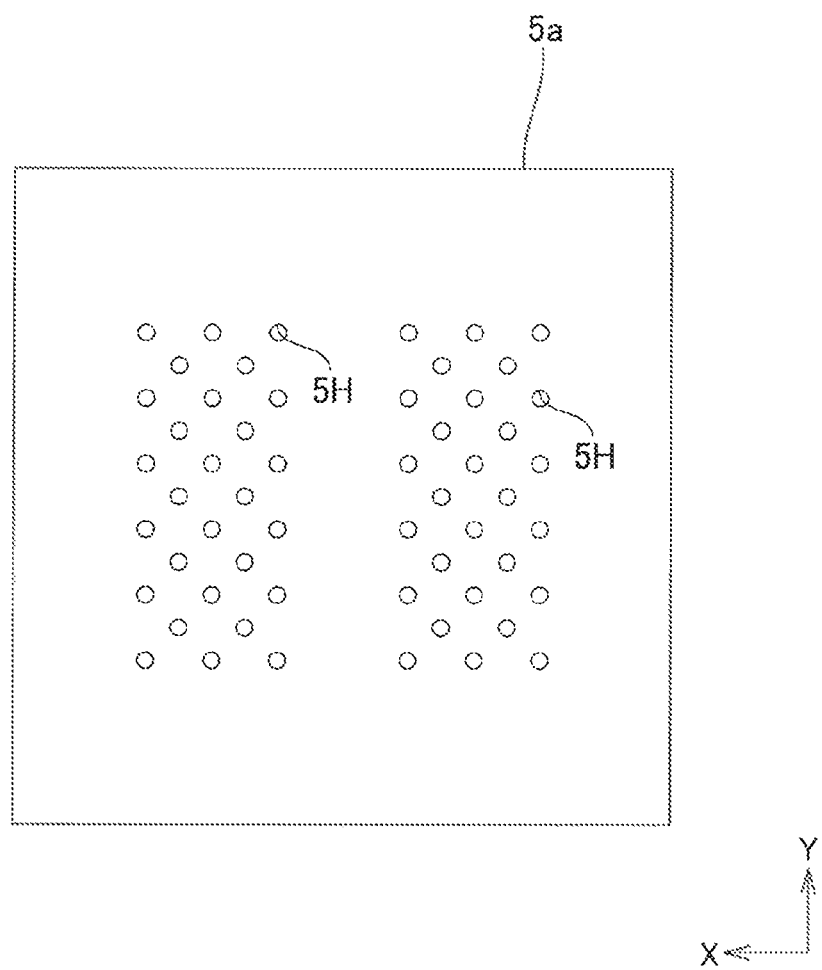
FIG. 6 is a plan view illustrating a modification of the reinforcing plate illustrated in FIG. 5.

The inspection jig 3 may include a reinforcing plate 5a illustrated in FIG. 6 instead of the reinforcing plate 5. In the reinforcing plate 5a, a plurality of through holes 5H corresponding to the plurality of through holes B2H of the first support plate B2 on a one-to-one basis are formed instead of the two opening portions 5C. The probe Pr may be inserted into each of the through holes 5H. The inner diameter of the through hole 5H is larger than that of the through hole B2H.

Referring to FIGS. 3 and 4, the spacer S having a substantially rectangular frame shape is stacked on the outer peripheral portion of the reinforcing plate 5.

The second support portion 312 is formed by stacking support plates A, A2, and A3. The support plates A, A2, and A3 are stacked in this order from the side farther from the first support portion 311. Through holes AH and A2H for supporting the probe Pr are formed on the support plates A and A2. A through hole A3H for supporting each probe Pr is formed in the support plate A3.

The second support portion 312 may be composed of two or less or four or more support plates.

The tip end side of the probe Pr is inserted through the through holes AH, A2H, and A3H. In this manner, the tip end side of the probe Pr is supported by the second support portion 312.

The separation holding member 7 having a substantially rectangular tubular shape extends from an outer peripheral portion of the support plate A3. The support plate A3 and the separation holding member 7 are integrally formed. In this manner, a separation block B is formed by the support plate A3 and the separation holding member 7. Note that the support plate A3 and the separation holding member 7 may be separated.

An end surface of the separation holding member 7 is attached to a surface of the spacer S on the second support portion 312 side. As a result, the first support plate B2 and the support plate A3, that is, the first support portion 311 and the second support portion 312 are held at a distance obtained by adding the length of the separation holding member 7 in the Z direction, the thickness of the spacer S, and the thickness of the reinforcing plate 5. The support plates A, A2, and A3, the reinforcing plate 5, the first support plate B2, and the second support plates C1, D, E1, and E2 are held in parallel.

The spacer S is a member for finely adjusting the space between the first support portion 311 and the second support portion 312, and the inspection jig 3 does not need to include the spacer S.

Further, the separation holding member 7 is not limited to a rectangular tubular member. The separation holding member may be any member that holds the first support portion 311 and the second support portion 312 by separating them from each other. For example, a rod-like support column may be used as the separation holding member.

The through holes AH, A2H, A3H, B2H, C1H, DH, E1H, and E2H are provided perpendicular to the respective plates so as to correspond to each other such that the same probe Pr is inserted therethrough. The positions of the through holes AH, A2H, A3H, B2H, C1H, DH, E1H, and E2H corresponding to the phases are deviated in the X direction with respect to the direction of the perpendicular line (Z direction) such that the probe Pr is inclined with respect to the perpendicular direction (Z direction) of the support plates A, A2, and A3, the first support plate B2, and the second support plates C1, D, E1, and E2.

In this manner, the probe Pr is supported to be inclined in the same direction in the X direction with respect to the Z direction. The tip end of the probe Pr projects from the support plate A in a state of not being in contact with the board 100. Hereinafter, the through holes AH, A2H, A3H, B2H, C1H, DH, E1H, E2H, and 5H are collectively referred to as a through hole H. Note that the through hole H may penetrate while being inclined with respect to the perpendicular direction of each plate.

Referring to FIG. 2, when the inspection jig 3 is viewed from the support plate A side, the plurality of through holes H are distributed in a first region P1 and a second region P2 that extend in a substantially rectangular shape elongated in the Y direction. The X direction corresponds to an example of the first direction, and the Y direction corresponds to an example of the second direction.

The through holes H are arranged at equal intervals in the first region P1 and the second region P2. The first region P1 and the second region P2 are separated by a distance larger than the space between the through holes H in the same region.

In the example illustrated in FIG. 2, the through holes H are provided in five columns in zigzag in the X direction (first direction) and in eleven columns in zigzag in the Y direction (second direction) in the first region P1. Similarly, the through holes H are provided in five columns in zigzag in the X direction (first direction) and in eleven columns in zigzag in the Y direction (second direction) in the second region P2.

That is, in the first region P1 and the second region P2 in which the through holes H are arranged at equal intervals, the number of columns of the through holes H corresponding to the X direction (first direction) is smaller than the number of columns of the through holes H corresponding to the Y direction (second direction). Note that the through holes H may be arranged linearly with respect to the X direction and the Y direction, that is, in a lattice shape, without limitation to the example of being arranged in zigzag. Although the example in which there are two regions in which the through holes H are arranged at equal intervals, the number of such regions may be one or three or more.

As described above, since the positions of the through holes H are deviated in the X direction (first direction) with respect to the direction of the perpendicular line (Z direction), the direction of deviation of the through holes H is along the X direction in which the number of columns of the through holes H is small.

Figure 7:
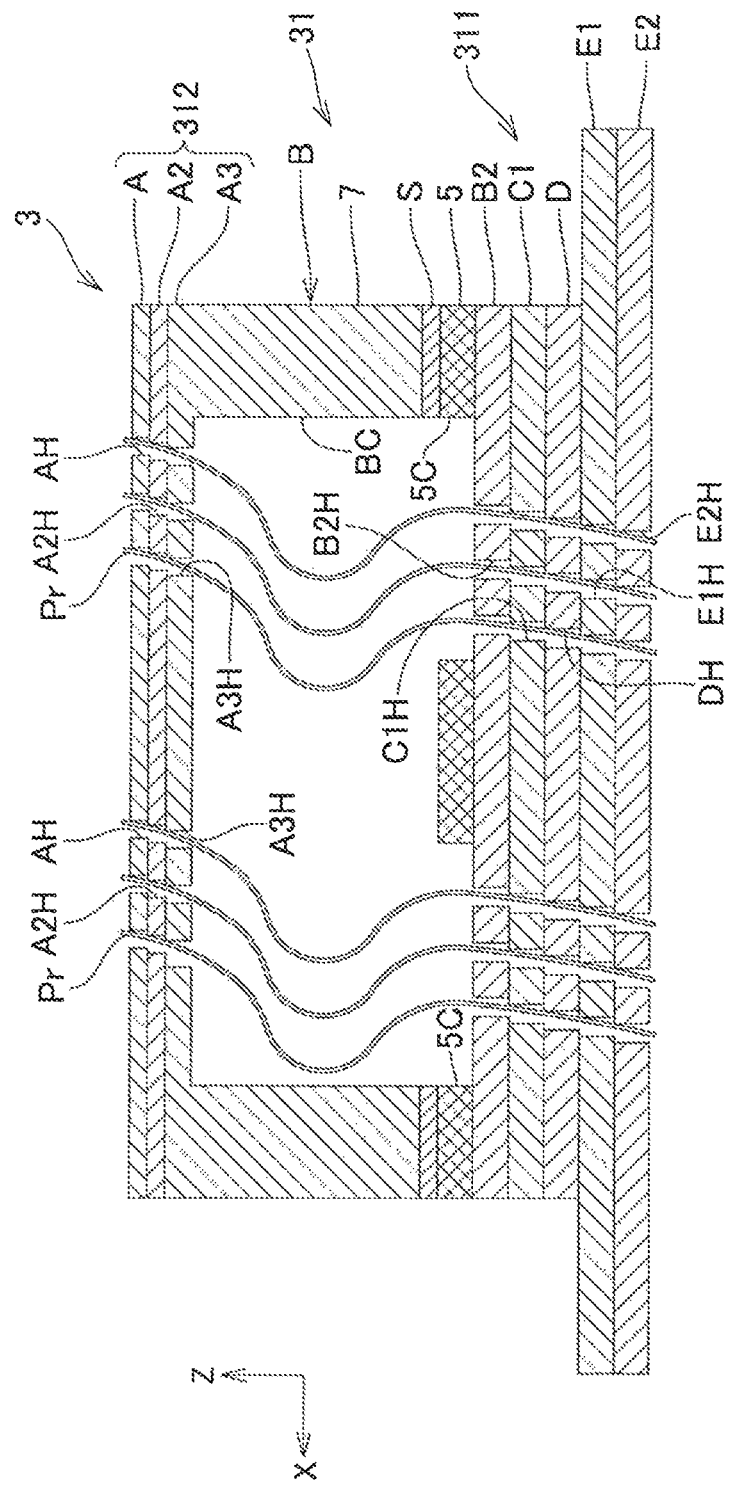
FIG. 7 is an explanatory view illustrating an example of a state in which the inspection jig is caused to abut on a board.

When the inspection jig 3 is brought into contact with the board 100 in order to inspect the board 100, the tip end of each of the probes Pr is pressed into the second support portion 312 as illustrated in FIG. 7. At this time, since the probes Pr are supported to be inclined in the same direction in the X direction, the probes Pr bend in the X direction to absorb a pressing amount of the probes Pr.

Here, the inclination of the probes Pr is determined by the direction of deviation of the through holes H. Since the direction of deviation of the through holes H is along the X direction (first direction) in which the number of columns of the through holes H is small, the inclination direction of the probes Pr and the bending direction of the probes Pr are also the X direction in which the number of columns of the through holes H is small.

When the probe Pr bends, the possibility of contact between the probes Pr adjacent to each other in the bending direction increases. However, in the inspection jig 3, since the probes Pr bend along the X direction (first direction) in which the number of columns of the through holes H is small, the possibility of contact between the probes Pr is low as compared with the case in which the probes Pr bend along the Y direction (second direction) in which the number of columns of the through holes H is large.

Note that the direction of deviation of the through holes H is not necessarily along the first direction in which the number of columns of the through holes H is small.

Referring to FIGS. 3 and 7, the support plates A, A2, and A3, the separation holding member 7, the spacer S, the first support plate B2, and the second support plates C1, D, E1, and E2 are made from an insulating material, for example, a resin material. The reinforcing plates 5 and 5a are stronger in bending strength than the first support plate B2 and the second support plates C1, D, E1, and E2. The reinforcing plates 5 and 5a can be made of a material such as ceramics or fine ceramics.

The bending strength of the reinforcing plates 5, 5a, and B2a can be evaluated, for example, in accordance with JIS R 1601 "Testing Methods for Room Temperature Bending Strength of Fine Ceramics" or ISO 14704. The bending strength of the first support plate B2 and the second support plates C1, D, E1, and E2 can be evaluated according to, for example, JIS K 7171 "Plastics—Determination of bending characteristics" or ISO 178. The method for evaluating the bending strength of each plate is as described below. Two locations sandwiching the through hole through which the probe is scheduled to pass through the support plate when the support plate is incorporated in the inspection jig, two locations where the stacked body of the support plate and the reinforcing plate faces the separation holding member are set as external supporting points, and a substantial center between the two external supporting points are set as a load point. In a case where an opening larger than an indenter of a load measuring device has a plate shape that is substantially at the center between the two external supporting points and cannot be applied with the load of the load measuring device, a location where the load is applied to the plate in the vicinity of the substantial center between the two external supporting points may be set as the load point. A stroke of the load measuring device when a predetermined load is applied to the load point to such an extent that the plate is not broken is measured. It can be evaluated that the bending strength is larger as the stroke is smaller. An optional value may be selected as the predetermined load, and the predetermined load is not limited to a measurement condition in the above standard. It is sufficient to evaluate the bending strength with the shape and dimension without processing of the plate regardless of the specifications of the shape, dimension, surface roughness, and the like of a test piece in the above standard. Regardless of the specification of the number of test pieces in the above standard, the number of plates used for the evaluation of the bending strength may be one.

The bending strength of the reinforcing plates 5 and 5a is higher than that of the first support plate B2 and the second support plates C1, D, E1, and E2, which are support portions that support the probe. As a result, the bending of the first support plate B2 and the second support plates C1, D, E1, and E2 is reduced by the reinforcing plates 5 and 5a, and the stress applied to the support portion that supports the probe can be reduced.

Hereinafter, a mechanism in which stress is applied to the support portion that supports the probe in the inspection jig not including the reinforcing plates 5 and 5a will be described.

Figure 8:
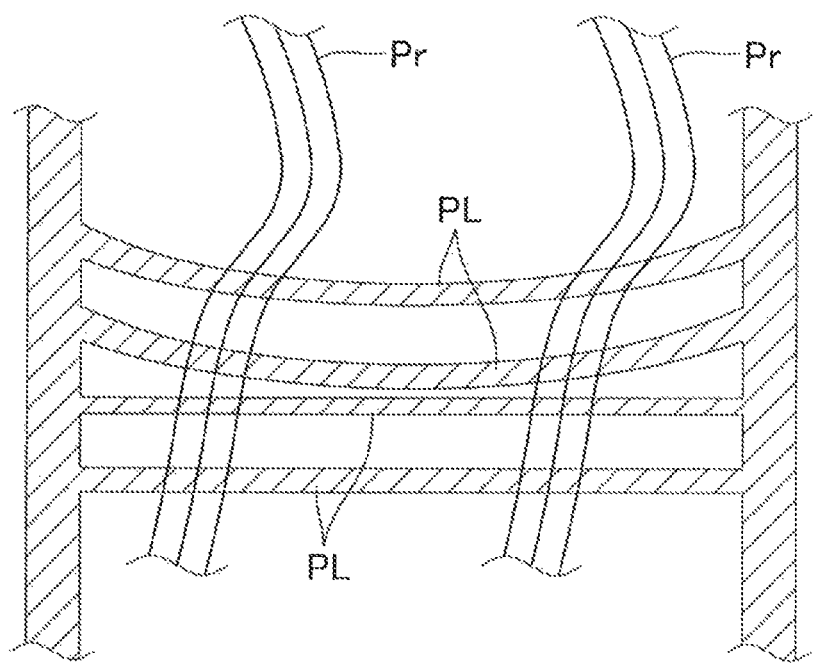
FIG. 8 is an explanatory view conceptually illustrating behavior of a plate when the probe is pressed.
Figure 9:
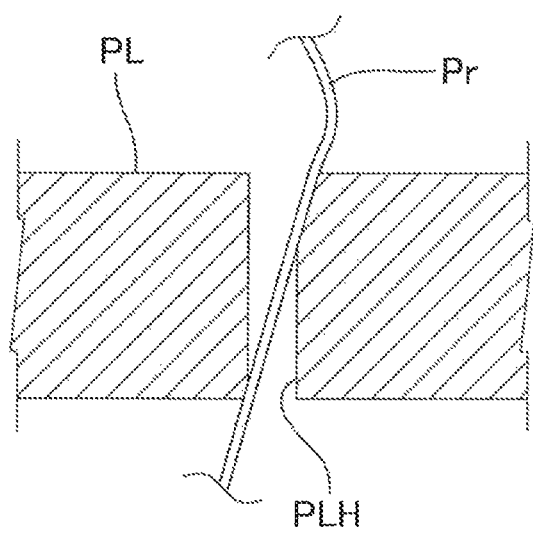
FIG. 9 is an enlarged explanatory view of a through hole formed on the plate and the probe.

Specifically, as illustrated in FIG. 8, when the inspection jig abuts on an inspection object and the probe Pr is pressed and bent, a plate PL is pressed and bent by the bent probe Pr. More specifically, as illustrated in FIG. 9, the bent probe Pr hits an opening edge portion of a through hole PLH of the plate PL and is caught, and strongly presses the plate PL.

Figure 10:
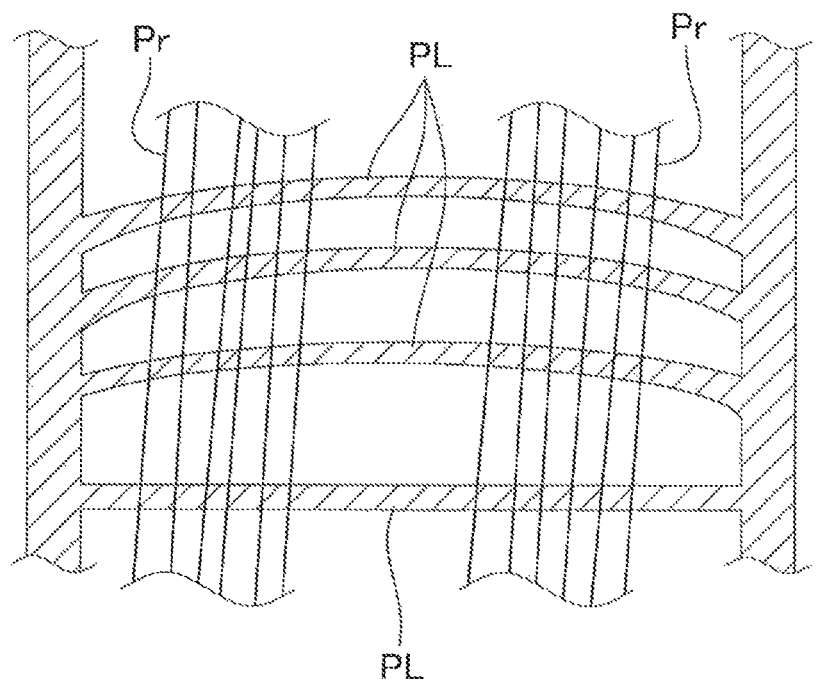
FIG. 10 is an explanatory view conceptually illustrating behavior of the plate when pressing load of the probe is released.
Figure 11:
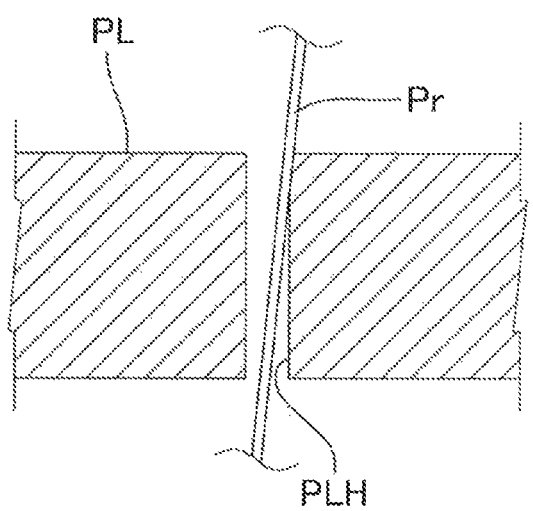
FIG. 11 is an enlarged explanatory view of a through hole formed on the plate and the probe.

In this state, when the inspection jig is separated from the inspection object and the probe Pr is about to return to the original position, the plate PL is pulled by the probe Pr and bent in the opposite direction as illustrated in FIG. 10. More specifically, the bent probe Pr is strongly pressed against an inner wall of the through hole PLH. For this reason, a large frictional force is generated with respect to the through hole PLH, and when the probe Pr returns to the original state as illustrated in FIG. 11, the probe Pr pulls the plate PL, and the plate PL is bent in the opposite direction. As described above, when the plate PL bends, stress is applied to the plate PL as a support portion that supports the probe Pr.

On the other hand, since the inspection jig 3 includes the reinforcing plates 5 and 5a having bending strength stronger than bending strength of the first support plate B2 and the second support plates C1, D, E1, and E2, bending of the first support plate B2 and the second support plates C1, D, E1, and E2 is suppressed by the reinforcing plates 5 and 5a. Therefore, as a result of reducing the bending of the first support plate B2 and the second support plates C1, D, E1, and E2, stress applied to the first support plate B2 and the second support plates C1, D, E1, and E2, which are support portions that support the probe Pr, can be easily reduced.

The first support plate B2 is softer in hardness than the second support plates C1, D, E1, and E2. As the hardness of each of the first support plate B2 and the second support plates C1, D, E1, and E2, for example, various indexes such as Vickers hardness, Brinell hardness, Nude hardness, Rockwell hardness, Super Finite hardness, Meyer hardness, Durometer hardness, Barkol hardness, Monotron hardness, Shore hardness, and Mohs hardness can be used. The hardness of the first support plate B2 and the second support plates C1, D, E1, and E2 can be evaluated according to, for example, JIS Z 2244 "Vickers hardness test—test method" or ISO 6507.

Figure 12:
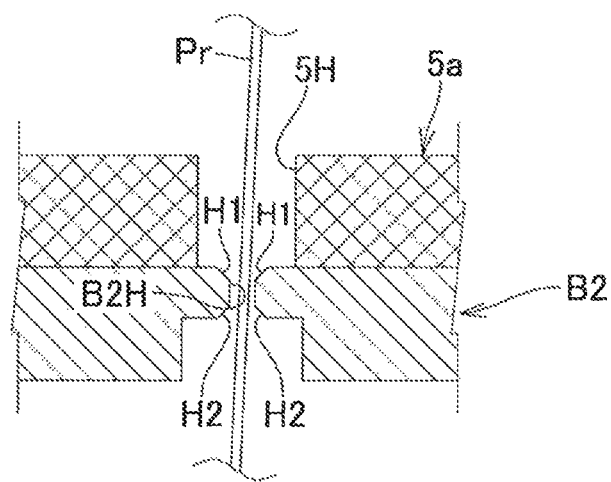
FIG. 12 is an enlarged end view illustrating the vicinity of a through hole of a first support plate.

FIG. 12 illustrates an example using the reinforcing plate 5a, but the reinforcing plate 5 may of course be used. When the probe Pr is bent, most of the load applied to the first support portion 311 due to the bending is applied to an opening edge portion H1 of the through hole B2H of the first support plate B2. For this reason, a frictional force generated by friction of the probe Pr is the largest in the through hole B2H among the through holes B2H, C1H, DH, E1H, and E2H. Therefore, by making the hardness of the first support plate B2 softer than that of the second support plates C1, D, E1, and E2, it is possible to reduce the possibility that the probe Pr is damaged.

The second support plates C1, D, E1, and E2 have bending strength stronger than that of the first support plate B2. As described above, since the hardness of the first support plate B2 is softer than that of the second support plates C1, D, E1, and E2, the possibility that the probe Pr is damaged can be reduced. On the other hand, a soft material generally has low bending strength.

Therefore, by combining the first support plate B2 having hardness softer than hardness of the second support plates C1, D, E1, and E2 and the second support plates C1, D, E1, and E2 having bending strength stronger than bending strength of the first support plate B2, it is possible to reduce the possibility that the probe Pr is damaged while securing bending strength of the entire first support portion 311.

The opening edge portions H1 and H2 of the through hole B2H of the first support plate B2 are chamfered. This increases the smoothness of the opening edge portions H1 and H2, so that it is possible to reduce the possibility that the probe Pr is damaged by friction with the opening edge portions H1 and H2. The chamfering may be performed to obtain a round surface with a round corner, a bevel surface with an obliquely cut corner, or various other chamfered shapes. As illustrated in FIG. 12, the large diameter portion and the small diameter portion may be connected to the through hole H of each support plate. In this case, the opening edge portion of the small diameter portion of the through hole H is chamfered.

Since the probe Pr bends on the second support portion 312 side of the first support plate B2, the friction between the opening edge portion H1 on the second support portion 312 side and the probe Pr is larger than the friction between the opening edge portion H2 on the second support plate C1 side and the probe Pr. Therefore, although FIG. 12 shows an example in which both the opening edge portions H1 and H2 are chamfered, of the opening edge portions H1 and H2, only the opening edge portion H1 on the second support portion 312 side where the friction with the probe Pr is larger may be chamfered.

Alternatively, the opening edge portions H1 and H2 of the through hole B2H of the first support plate B2 may not be chamfered.

The positions of the through holes H of the support plates do not need to be deviated, and the probe Pr is not limited to the example of being supported in an inclined manner. The second support plates C1, D, E1, and E2 are not limited to the example in which the bending strength is stronger than that of the first support plate B2, and the first support plate B2 is not limited to the example in which the hardness is softer than that of the second support plates C1, D, E1, and E2.

The support member 31 may not include the reinforcing plate 5, and the first support plate B2 may function as the reinforcing plate.

Figure 13:
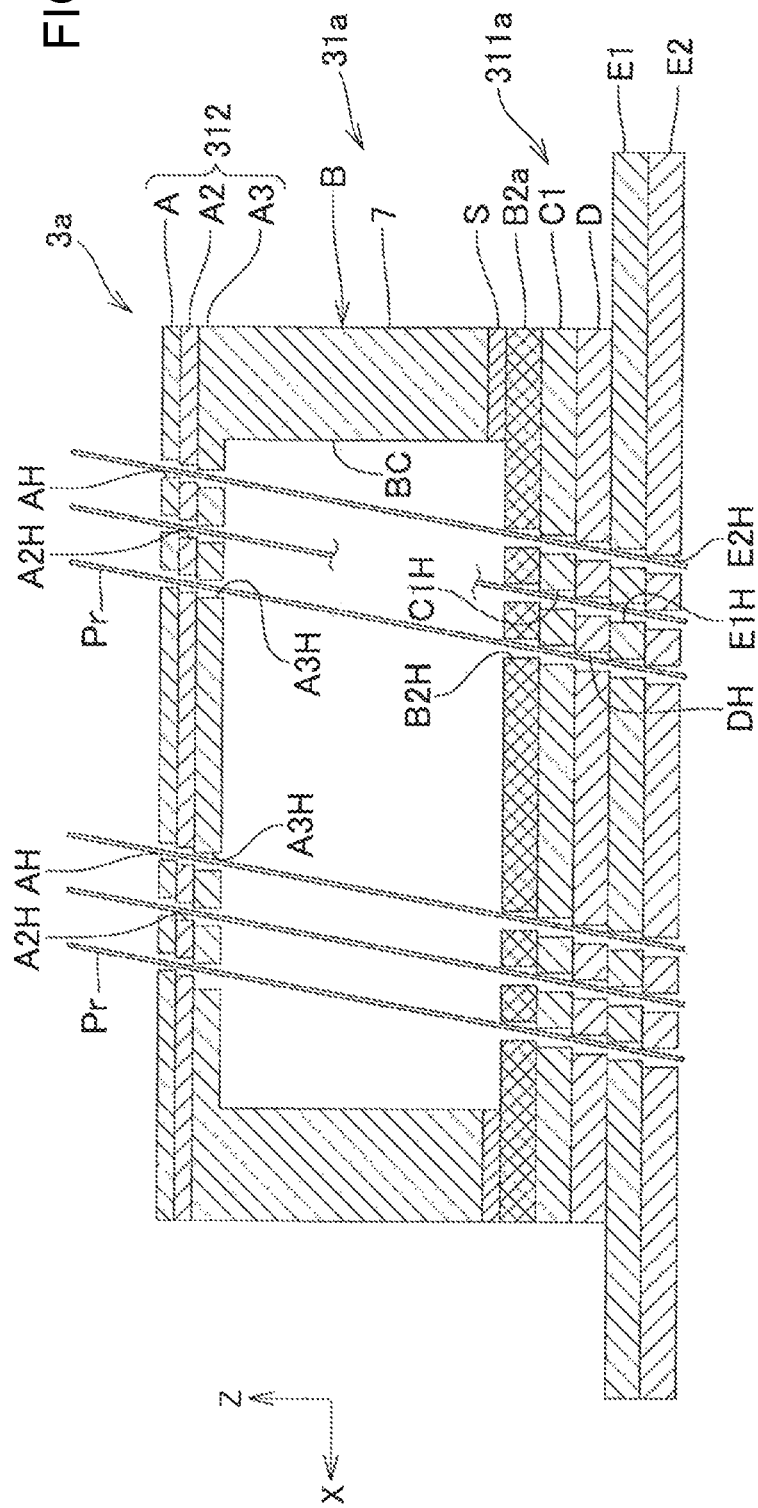
FIG. 13 is an end view illustrating a modification of the inspection jig illustrated in FIG. 3.
Figure 14:
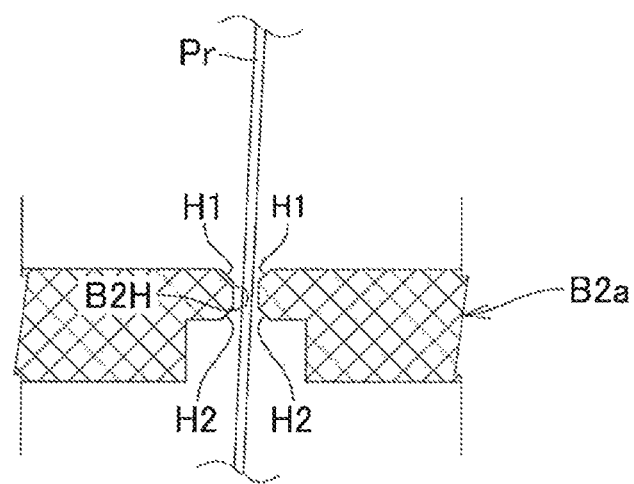
FIG. 14 is an enlarged end view illustrating the vicinity of a through hole of a reinforcing plate.

As illustrated in FIGS. 13 and 14, a support member 31a of an inspection jig 3a includes a reinforcing plate B2a instead of the reinforcing plates 5 and 5a. The reinforcing plate B2a has the same shape as the first support plate B2. The reinforcing plate B2a is made of the same material as the reinforcing plates 5 and 5a, or has the same bending strength as the reinforcing plates 5 and 5a.

A first support portion 311a of the support member 31a does not include the first support plate B2, and is configured by stacking the second support plates C1, D, E1, and E2 (one or a plurality of support plates) in the Z direction. In this case, the second support plate C1 corresponds to the opposing support plate closest to the second support portion 312 among one or the plurality of support plates.

According to the inspection jig 3a, the bending of the second support plates C1, D, E1, and E2 is reduced by the reinforcing plate B2a, and the stress applied to the support portion that supports the probe Pr can be reduced. Instead of the reinforcing plate 5 or the reinforcing plate 5a and the first support plate B2 in the inspection jig 3, the inspection jig 3a only needs to include the reinforcing plate B2a. Therefore, the configuration of the inspection jig 3a can be simplified.

The reinforcing plate B2a has the same shape as the first support plate B2. Therefore, similarly to the inspection jig 3, the inspection jig 3a can bend the probes Pr in the X direction by inclining the probes Pr in the same direction in the X direction. In the inspection jig 3a, similarly to the inspection jig 3, the probes Pr are bent along the X direction (first direction) in which the number of columns of the through holes H is small, so that the possibility of contact between the probes Pr is reduced.

Although the example in which the first support portion 311a includes the four second support plates C1, D, E1, and E2 as the support plates has been described, the first support portion 311a may include one support plate or five or more support plates. When the first support portion 311a includes one support plate, the support plate corresponds to the opposing support plate.

Similar to the first support plate B2, since the opening edge portions H1 and H2 of the through hole B2H of the reinforcing plate B2a are chamfered, it is possible to reduce the possibility that the probe Pr is damaged by friction with the opening edge portions H1 and H2. Of the opening edge portions H1 and H2 of the reinforcing plate B2a, only the opening edge portion H1 on the second support portion 312 side where the friction with the probe Pr is larger may be chamfered.

Alternatively, the opening edge portions H1 and H2 of the through hole B2H of the reinforcing plate B2a may not be chamfered.

Figure 15:
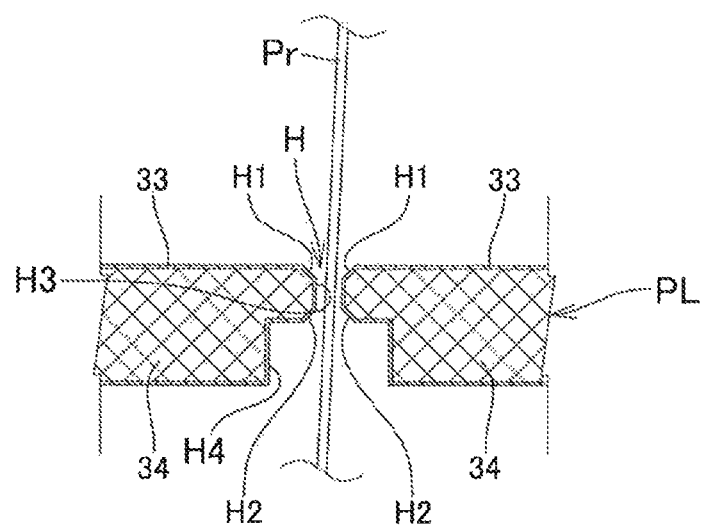
FIG. 15 is a cross-sectional view illustrating an example of a smooth layer formed on the plate.

In the inspection jigs 3 and 3a, a smooth layer 33, which is, for example, a coating layer for reducing friction, can be formed on the inner surface of the through holes H of the support plates or the reinforcing plates 5a and B2a. In FIG. 15, each of the support plates or the reinforcing plates 5a and B2a is shown as a plate PL, and the through hole H is shown in more detail. The inner surface of the through hole H of the plate PL includes chamfered opening edge portions H1 and H2 (chamfered portions) and a through hole main body H3 that is a portion of the inner surface of the through hole H excluding the opening edge portions H1 and H2. In the plate PL, for example, a large diameter portion H4 coaxial with the through hole H and having a larger diameter than the through hole H is connected to the through hole H.

As illustrated in FIG. 15, the smooth layer 33 may be formed on the entire surface of the plate PL including the inner surface of each through hole H. However, since the probe Pr is not in contact with a portion other than the inner surface of the through hole H, the smooth layer 33 does not need to be formed in a portion other than the inner surface of the through hole H.

The smooth layer 33 may be formed on at least one of the through hole main body H3 and the opening edge portion H1 of the inner surface of the through hole H.

The thickness of the smooth layer 33 is, for example, about 1 μm. A friction coefficient of the smooth layer 33 with respect to the probe Pr is smaller than a friction coefficient of a base portion 34 of the smooth layer 33 on the plate PL. The smooth layer 33 can be formed by, for example, depositing a material having a small friction coefficient. The magnitude of the friction coefficient may be compared between dynamic friction coefficients or between static friction coefficients.

As a material of the smooth layer 33, for example, a paraxylylene-based polymer can be used, and an insulating material having a small friction coefficient, such as parylene (registered trademark), fluorine, polyester, or acrylic.

By forming the smooth layer 33 on the inner surface of the through hole H in this manner, friction between the through hole H and the probe Pr can be reduced.

The probe Pr bends on the second support portion 312 side of the first support plate B2 or the reinforcing plates 5a and B2a. Therefore, the contact pressure between the probe Pr and the through hole B2H of the first support plate B2, the through hole B2H of the reinforcing plate B2a, or the through hole 5H of the reinforcing plate 5a tends to be higher than the contact pressure between the other through holes H and the probe Pr, and friction tends to occur.

Therefore, the smooth layer 33 may be formed at least on the inner surface of the through hole B2H of the first support plate B2, the through hole B2H of the reinforcing plate B2a, or the through hole 5H of the reinforcing plate 5a.

That is, an inspection jig according to an exemplary embodiment of the present disclosure includes: a rod-shaped probe; a first support portion that supports one end portion side of the probe; a second support portion that supports the other end portion side of the probe; and a separation holding member that holds the first support portion and the second support portion while separating the first support portion and the second support portion from each other, in which the first support portion includes a support plate in which a through hole through which the probe is inserted is formed, and a reinforcing plate having bending strength stronger than that of the support plate is disposed on a surface of the support plate facing the second support portion.

According to this configuration, since the reinforcing plate having bending strength higher than that of the support plate is disposed on the surface of the support plate facing the second support portion, the bending of the support plate is reduced by the reinforcing plate. As a result, it is easy to reduce the stress applied to the support plate which is the support portion that supports the probe.

In some instances, the first support portion includes a plurality of the stacked support plates, the plurality of support plates include a first support plate that is a support plate closest to the second support portion and a second support plate that is a support plate other than the first support plate, and the reinforcing plate is disposed on a surface of the first support plate facing the second support portion.

According to this configuration, the plurality of support plates are stacked to form the first support portion. Since the probe is largely bent between the first support portion and the second support portion, the first support plate, which is the support plate closest to the second support portion among the plurality of support plates of the first support portion, is most likely to receive the force due to the bending of the probe. The reinforcing plate is disposed on the first support plate that is most susceptible to the force due to the bending of the probe. In this manner, by reinforcing the support plate that is most susceptible to the force due to the bending of the probe, it is easy to reduce the stress applied to the support portion.

The first support plate can be softer in hardness than the second support plate.

Since the probe greatly bends between the first support portion and the second support portion, when the probe bends, friction between the through hole of the first support plate and the probe is larger than friction between the through hole of the second support plate and the probe. Therefore, by making the hardness of the first support plate having a large friction softer than that of the second support plate, it is easy to reduce the possibility that the probe is damaged.

The second support plate can be stronger in bending strength than the first support plate.

A material having soft hardness generally tends to have weak bending strength. Therefore, by combining the first support plate having soft hardness and the second support plate having strong bending strength, it is easy to reduce the risk of damaging the probe while securing the bending strength of the entire first support portion.

In some instances the through hole of the first support plate and the through hole of the second support plate corresponding to each other such that a same probe is inserted therethrough are disposed such that a position of the through hole of the first support plate and a position of the through hole of the second support plate are deviated with respect to a direction of a perpendicular line so as to cause the probe to be inclined with respect to the perpendicular line between the first and second support plates.

According to this configuration, it is easy to support the probe in an inclined manner by the through holes formed in the first and second support plates.

In some instances, a plurality of the through holes are formed in the first and second support plates, a plurality of the through holes are arranged in a plurality of columns corresponding to a predetermined first direction, a plurality of the through holes are arranged in a plurality of columns corresponding to a second direction intersecting the first direction, a number of columns corresponding to the first direction is smaller than a number of columns corresponding to the second direction in a region where the through holes are arranged at equal intervals, and a direction of the deviation is along the first direction.

According to this configuration, the direction of deviation of the through holes is along the first direction in which the number of columns of the through holes is small. Since the probe is inclined along the first direction, which is the direction of deviation of the through hole, the probe is bent along the first direction. Therefore, since the probes are bent in a direction in which the number of columns of the through holes is small, that is, the number of columns of the probes is small, the possibility of contact between the probes is reduced as compared with the case where the probes are bent along the second direction in which the number of columns is large.

An opening edge portion of the through hole of the first support plate on the second support portion side can be chamfered.

According to this configuration, since the opening edge portion on the second support portion side where friction with the bent probe is likely to occur is chamfered and the smoothness is increased, it is easy to reduce the possibility that the probe is damaged by friction with the opening edge portion.

In some instances, a plurality of the through holes are formed in the first and second support plates, and an opening opened to include a region including the plurality of through holes of the first support plate in the opening is formed in the reinforcing plate.

According to this configuration, since it is not necessary to form through holes as many as the number of probes in the reinforcing plate, it is easy to form the reinforcing plate.

In some instances, a smooth layer for reducing friction is formed on an inner surface of the through hole of the first support plate, and a friction coefficient of the smooth layer with respect to the probe is smaller than a friction coefficient of a base portion of the smooth layer in the first support plate.

According to this configuration, friction between the probe inserted into the through hole and the inner surface of the through hole is reduced.

An opening edge portion on the second support portion side of the through hole of the first support plate can be a chamfered portion by being chamfered, a smooth layer for reducing friction can be formed on at least one of a through hole main body which is a portion excluding the chamfered portion and the chamfered portion on an inner surface including the chamfered portion in the through hole, and a friction coefficient of the smooth layer with respect to the probe can be smaller than a friction coefficient of a base portion of the smooth layer on the first support plate.

According to this configuration, friction between the probe and at least one of the through hole main body and the chamfered portion in the through hole can be reduced.

It may be that a plurality of the through holes are formed in one or a plurality of the support plates, and a plurality of through holes corresponding one-to-one to the plurality of through holes of an opposing support plate which is a support plate closest to the second support portion among the one or a plurality of support plates are formed in the reinforcing plate.

According to this configuration, since the region where the through hole is formed in the support plate can also be reinforced by the reinforcing plate, the effect of reducing the stress applied to the support portion that supports the probe is improved.

It may be that the through hole of the reinforcing plate and the through hole of the opposing support plate corresponding to each other such that the same probe is inserted therethrough are disposed such that a position of the through hole of the reinforcing plate and a position of the through hole of the opposing support plate are deviated with respect to a direction of a perpendicular line so as to cause the probe to be inclined with respect to the perpendicular line between the reinforcing plate and the opposing support plate.

According to this configuration, it is easy to support the probe in an inclined manner by the through hole formed in the reinforcing plate and the opposing support plate.

It may be that the plurality of through holes of the reinforcing plate and the opposing support plate are arranged in a plurality of columns corresponding to a predetermined first direction and arranged in a plurality of columns corresponding to a second direction intersecting the first direction, the number of columns corresponding to the first direction is smaller than the number of columns corresponding to the second direction, and a direction of the deviation is along the first direction.

According to this configuration, the direction of deviation of the through holes is along the first direction in which the number of columns of the through holes is small. Since the probe is inclined along the first direction, which is the direction of deviation of the through hole, the probe is bent along the first direction. Therefore, since the probes are bent in a direction in which the number of columns of the through holes is small, that is, the number of columns of the probes is small, the possibility of contact between the probes is reduced as compared with the case where the probes are bent along the second direction in which the number of columns is large.

An opening edge portion on the second support portion side of the through hole of the reinforcing plate can be chamfered.

According to this configuration, since the opening edge portion on the second support portion side where friction with the bent probe is likely to occur is chamfered and the smoothness is increased, it is easy to reduce the possibility that the probe is damaged by friction with the opening edge portion.

In some instances, a smooth layer for reducing friction is formed on an inner surface of the through hole of the reinforcing plate, and a friction coefficient of the smooth layer with respect to the probe is smaller than a friction coefficient of a base portion of the smooth layer in the reinforcing plate.

According to this configuration, friction between the probe inserted into the through hole and the inner surface of the through hole is reduced.

An opening edge portion on the second support portion side of the through hole of the reinforcing plate can be a chamfered portion by being chamfered, a smooth layer for reducing friction can be on at least one of a through hole main body which is a portion excluding the chamfered portion and the chamfered portion on an inner surface including the chamfered portion in the through hole, and a friction coefficient of the smooth layer with respect to the probe can be smaller than a friction coefficient of a base portion of the smooth layer on the reinforcing plate.

According to this configuration, friction between the probe and at least one of the through hole main body and the chamfered portion in the through hole can be reduced.

An inspection device according to an exemplary embodiment of the present disclosure includes the inspection jig described above and an inspection processing unit that inspects an inspection object based on an electric signal obtained by bringing the probe into contact with an inspection point provided on the inspection object.

According to this configuration, in the inspection jig used for inspection, it is easy to reduce the stress applied to the support portion that supports the probe.

The inspection jig and the inspection device having such a configuration can easily reduce the stress applied to the support portion that supports the probe.

This application is based on Japanese Patent Application No. 2020-71031 filed on Apr. 10, 2020 and Japanese Patent Application No. 2020-131206 filed on Jul. 31, 2020, the contents of which are included in the present application. It should be noted that the specific embodiment or examples made in the modes for carrying out aspects of the present disclosure are merely for clarifying the technical contents of the present disclosure, and the present disclosure is not limited only to such specific examples. It should not be construed in a narrow sense by limiting only.

Features of the above-described embodiments and the modifications thereof may be combined appropriately as long as no conflict arises.

While various embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig comprising:
 a rod-shaped probe;
 a first support portion configured to support one end portion side of the probe;
 a second support portion configured to support another end portion side of the probe; and
 a separation holding member configured to hold the first support portion and the second support portion while separating the first support portion and the second support portion from each other, wherein
 the first support portion includes a support plate in which a through hole through which the probe is inserted is formed,
 a reinforcing plate having bending strength higher than bending strength of the support plate is disposed on a surface of the support plate facing the second support portion,
 the first support portion includes a plurality of the support plates stacked,
 the plurality of support plates includes a first support plate that is a support plate closest to the second support portion, and a second support plate that is a support plate other than the first support plate, and
 the first support plate is softer in hardness than the second support plate.

2. The inspection jig according to claim 1, wherein the reinforcing plate is disposed on a surface of the first support plate facing the second support portion.

3. The inspection jig according to claim 1, wherein the second support plate is stronger in bending strength than the first support plate.

4. The inspection jig according to claim 1, wherein the through hole of the first support plate and the through hole of the second support plate corresponding to each other such that a same probe is inserted therethrough are disposed such that a position of the through hole of the first support plate and a position of the through hole of the second support plate are deviated with respect to a direction of a perpendicular line so as to cause the probe to be inclined with respect to the perpendicular line between the first and second support plates.

5. The inspection jig according to claim 4, wherein
 a plurality of the through holes are formed in the first and second support plates,
 the plurality of through holes are arranged in a plurality of columns corresponding to a predetermined first direction and arranged in a plurality of columns corresponding to a second direction intersecting the first direction, and in a region where the through holes are arranged at equal intervals, a number of columns corresponding to the first direction is smaller than a number of columns corresponding to the second direction, and
 a direction of the deviation is along the first direction.

6. The inspection jig according to claim 1, wherein
a plurality of the through holes are formed in the first and second support plates, and
the reinforcing plate is formed with an opening opened to include a region including the plurality of through holes of the first support plate in the opening.

7. The inspection jig according to claim 1, wherein
a smooth layer for reducing friction is formed on an inner surface of the through hole of the first support plate, and
a friction coefficient of the smooth layer with respect to the probe is smaller than a friction coefficient of a base portion of the smooth layer in the first support plate.

8. The inspection jig according to claim 1, wherein
a plurality of the through holes are formed in one or a plurality of the support plates, and
the reinforcing plate is formed with a plurality of through holes corresponding one-to-one to the plurality of through holes of an opposing support plate which is a support plate closest to the second support portion among the one or plurality of support plates.

9. The inspection jig according to claim 8, wherein
the through hole of the reinforcing plate and the through hole of the opposing support plate corresponding to each other such that the same probe is inserted therethrough are disposed such that a position of the through hole of the reinforcing plate and a position of the through hole of the opposing support plate are deviated with respect to a direction of a perpendicular line so as to cause the probe to be inclined with respect to the perpendicular line between the reinforcing plate and the opposing support plate,
the plurality of through holes of the reinforcing plate and the opposing support plate are arranged in a plurality of columns corresponding to a predetermined first direction and arranged in a plurality of columns corresponding to a second direction intersecting the first direction, and the number of columns corresponding to the first direction is smaller than the number of columns corresponding to the second direction, and
a direction of the deviation is along the first direction.

10. The inspection jig according to claim 8, wherein
a smooth layer for reducing friction is formed on an inner surface of the through hole of the reinforcing plate, and
a friction coefficient of the smooth layer with respect to the probe is smaller than a friction coefficient of a base portion of the smooth layer in the reinforcing plate.

11. An inspection device comprising:
the inspection jig according to claim 8; and
an inspection processing unit configured to inspect an inspection object based on an electric signal obtained by bringing the probe into contact with an inspection point provided on the inspection object.

12. An inspection jig comprising:
a rod-shaped probe;
a first support portion configured to support one end portion side of the probe;
a second support portion configured to support another end portion side of the probe; and
a separation holding member configured to hold the first support portion and the second support portion while separating the first support portion and the second support portion from each other, wherein
the first support portion includes a support plate in which a through hole through which the probe is inserted is formed,
a reinforcing plate having bending strength higher than bending strength of the support plate is disposed on a surface of the support plate facing the second support portion,
the first support portion includes a plurality of the support plates stacked,
the plurality of support plates includes a first support plate that is a support plate closest to the second support portion, and a second support plate that is a support plate other than the first support plate, and
wherein the second support plate is stronger in bending strength than the first support plate.

13. The inspection jig according to claim 12, wherein
the reinforcing plate is disposed on a surface of the first support plate facing the second support portion.

14. The inspection jig according to claim 12, wherein the through hole of the first support plate and the through hole of the second support plate corresponding to each other such that a same probe is inserted therethrough are disposed such that a position of the through hole of the first support plate and a position of the through hole of the second support plate are deviated with respect to a direction of a perpendicular line so as to cause the probe to be inclined with respect to the perpendicular line between the first and second support plates.

15. The inspection jig according to claim 14, wherein
a plurality of the through holes are formed in the first and second support plates,
the plurality of through holes are arranged in a plurality of columns corresponding to a predetermined first direction and arranged in a plurality of columns corresponding to a second direction intersecting the first direction, and in a region where the through holes are arranged at equal intervals, a number of columns corresponding to the first direction is smaller than a number of columns corresponding to the second direction, and
a direction of the deviation is along the first direction.

16. The inspection jig according to claim 12, wherein
a plurality of the through holes are formed in the first and second support plates, and
the reinforcing plate is formed with an opening opened to include a region including the plurality of through holes of the first support plate in the opening.

17. The inspection jig according to claim 12, wherein
a smooth layer for reducing friction is formed on an inner surface of the through hole of the first support plate, and
a friction coefficient of the smooth layer with respect to the probe is smaller than a friction coefficient of a base portion of the smooth layer in the first support plate.

18. The inspection jig according to claim 12, wherein
a plurality of the through holes are formed in one or a plurality of the support plates, and
the reinforcing plate is formed with a plurality of through holes corresponding one-to-one to the plurality of through holes of an opposing support plate which is a support plate closest to the second support portion among the one or plurality of support plates.

19. The inspection jig according to claim 18, wherein
the through hole of the reinforcing plate and the through hole of the opposing support plate corresponding to each other such that the same probe is inserted therethrough are disposed such that a position of the through hole of the reinforcing plate and a position of the through hole of the opposing support plate are deviated with respect to a direction of a perpendicular line so as to cause the probe to be inclined with respect to the perpendicular line between the reinforcing plate and the opposing support plate, the plurality of through holes of the reinforcing plate and the opposing support plate are arranged in a plurality of columns corresponding to a predetermined first direction and arranged in a plurality of columns corresponding to a second direction intersecting the first direction, and the number of columns corresponding to the first direction is smaller than the number of columns corresponding to the second direction, and a direction of the deviation is along the first direction.

20. An inspection device comprising:

the inspection jig according to claim 18; and an inspection processing unit configured to inspect an inspection object based on an electric signal obtained by bringing the probe into contact with an inspection point provided on the inspection object.

* * * * *